United States Patent
Wu et al.

(10) Patent No.: US 6,780,761 B1
(45) Date of Patent: Aug. 24, 2004

(54) VIA-FIRST DUAL DAMASCENE PROCESS

(75) Inventors: Chih-Ning Wu, Hsin-Chu (TW); Ming-Hsing Liu, Tai-Nan (TW); Hsiao-Pang Chou, Taipei Hsien (TW); Ching-Piao Lin, Taipei Hsien (TW); Pei-Jen Wang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/604,771

(22) Filed: Aug. 15, 2003

(51) Int. Cl.$^7$ ............................................. H01L 21/4763
(52) U.S. Cl. ........................ 438/637; 438/638; 438/666; 438/780; 438/782
(58) Field of Search ................................ 438/637–638, 438/666, 780, 782

(56) References Cited

U.S. PATENT DOCUMENTS 6,432,814 B1 * 8/2002 Steiner et al. .............. 438/624
6,579,791 B1 * 6/2003 Iu .............................. 438/637

* cited by examiner

Primary Examiner—Lynne Gurley
(74) Attorney, Agent, or Firm—Winston Hsu

(57) ABSTRACT

The present invention pertains to a via-first dual damascene process. A semiconductor substrate having a conductive structure and a dielectric layer on the semiconductor substrate is provided. The dielectric layer has a via opening exposing the conductive structure. The via opening is filled with a gap-filling polymer to form a gap-filling polymer (GFP) layer on the dielectric layer. The GFP layer is etched back to a predetermined depth such that an exposed surface of the GFP layer is lower than surface of the dielectric layer to form a recess, thereby exposing portions of sidewalls of the via opening. A surface treatment for altering surface property of the sidewalls and the exposed surface of the GFP layer is then carried out, thereby preventing a subsequent deep UV photoresist from interacting with the sidewalls or the exposed surface of the GFP layer either in a chemical or physical way.

21 Claims, 13 Drawing Sheets

VIA-FIRST DUAL DAMASCENE PROCESS

BACKGROUND OF INVENTION

1. Field of the Invention

The present invention relates generally to copper interconnects. More particularly, the present invention relates to a via-first dual damascene process capable solving DUV photoresist residue in an isolated via recess during the trench patterning.

2. Description of the Prior Art

Damascene processes incorporated with copper interconnect technique are known in the art, which are also referred to as "copper damascene processes" in the semiconductor industry. The copper damascene processes provide a solution to form a conductive wire coupled with an integral via plug without the need of dry etching copper. Either a single damascene or a dual damascene structure is used to connect devices and/or wires of an integrated circuit. Typically, the dual damascene process encompasses trench-first, via-first, partial-via, and self-aligned processes, in which the via-first dual damascene process comprises first defining a via opening in dielectrics and then defining a trench above the via opening by using several lithographic and etching steps.

Please refer to FIG. 1 to FIG. 5. FIG. 1 to FIG. 5 are cross-sectional schematic diagrams showing several typical intermediate phases of a semiconductor wafer during the via-first dual damascene process according to the prior art method. As shown in FIG. 1, a semiconductor substrate 100 is provided. A conductive structure 111 and conductive structure 112 such as damascened copper wirings are provided in a device layer 101 of the semiconductor substrate 100. Subsequently, a capping layer 115 such as silicon nitride is deposited to cover the exposed conductive structures 111 and 112, and the device layer 101 over the semiconductor substrate 100. A stacked dielectric layer 120 is formed on the capping layer 115. The stacked dielectric layer 120 is typically composed of a first dielectric layer 121, a second dielectric layer 123, and an etch-stop layer 122 interposed between the first dielectric layer 121 and the second dielectric layer 123. A silicon oxy-nitride layer 130 is then deposited on the first dielectric layer 121. Thereafter, a first DUV photoresist layer 140 having via openings 141 and 142 is formed on the silicon oxy-nitride layer 130, assuming that the via opening 141 is an isolated via pattern, i.e. there is no other via opening located in the proximity of the via opening 141, and the via opening 142 is a dense via pattern. Using the first DUV photoresist layer 140 as a etching mask, an etching process is performed to etch away, in the order of, the silicon oxy-nitride layer 130, the stacked layer 120, to the capping layer 115, through the via openings 141 and 142, thereby forming deep via holes 151 and 152.

As shown in FIG. 2, after stripping the first DUV photoresist layer 140 off the silicon oxy-nitride layer 130, a gap-filling polymer (GFP) layer 201 is coated on the semiconductor substrate 100 and fills the via holes 151 and 152. The GFP layer 201 is typically composed of an i-line resist known in the art. Coating of the GFP layer 201 is known in the art and optional post-baking step may be carried out if desired. As shown in FIG. 3, the GFP layer 201 is then etched back to a predetermined depth, such that the exposed surface of the GFP layer 201 is lower than the surface of the silicon oxy-nitride layer 130, thereby forming recesses 301 and 302. As shown in FIG. 4, a second DUV photoresist layer 401 is coated on the semiconductor substrate 100 and fills the recesses 301 and 302 using spin coating method known in the art.

Please refer to FIG. 6 with respect to FIG. 5, where FIG. 5 is a cross sectional view of FIG. 6 along line AA", FIG. 6 is a top view of FIG. 5. Following the coating of the second DUV photoresist layer 401, a lithographic process is carried out. In the lithographic process (or trench photo-lithographic process), a mask (not shown) having a predetermined trench pattern thereon is provided as a photo-mask, which is positioned over the semiconductor substrate 100. Light such as deep UV is projected on the photo-mask and passes through clear areas of the photo-mask to irradiate the underlying second DUV photoresist layer 401, thereby forming latent trench images (not shown), which is soluble in a developer, over the respective recesses 301 and 302 in the second DUV photoresist layer 401. Thereafter, the exposed second DUV photoresist layer 401 is developed using a proper developer that is usually hydrophilic. The latent trench images are removed to form trenches 411 and 412 over the recesses 301 and 302, respectively.

As best seen in FIG. 5, however, DUV photoresist residues 511 are observed at the bottom of the recess 301 (some might be left on the sidewalls of the recess 301) over the isolated via hole 151 after the development of the second DUV photoresist layer 401. The DUV photoresist residue 511 results in undesired micro-trenching effects or fences in the isolated via hole 151, which affect the performance of the integrated circuit. The phenomenon of the DUV photoresist residue 511 might be caused due to the fact that the upper surface of the GFP layer 201 is a hydrophobic surface, while the developer is hydrophilic solution. Further, capillarity deteriorates the DUV photoresist residue phenomenon during the development of the second DUV photoresist layer 401.

SUMMARY OF INVENTION

Accordingly, the primary object of the present invention is to provide an improved dual damascene process to alleviate or eliminate DUV residue in the isolated via at the scale of deep sub-micron, thereby avoiding the above-mentioned micro-trenching or fence effects.

To achieve the above object, a via-first dual damascene process is provided.

The via-first dual damascene process includes the following steps:

providing a semiconductor substrate having a conductive structure and a dielectric layer on the semiconductor substrate, wherein the dielectric layer has a via opening exposing the conductive structure;

filling the via opening with a gap-filling polymer to form a gap-filling polymer (GFP) layer on the dielectric layer;etching the GFP layer back to a predetermined depth such that an exposed surface of the GFP layer is lower than surface of the dielectric layer to form a recess, thereby exposing portions of sidewalls of the via opening; and performing a surface treatment for altering surface property of the sidewalls and the exposed surface of the GFP layer, thereby preventing a subsequent deep UV photoresist from interacting with the sidewalls or the exposed surface of the GFP layer either in a chemical or physical way.

In accordance with the present invention, an improved via-first dual damascene process is provided. The via-first dual damascene process includes the following steps:

providing a semiconductor substrate having a conductive structure and a dielectric layer on the semiconductor substrate, wherein the dielectric layer has a via opening exposing the conductive structure;

filling the via opening with a gap-filling polymer to form a gap-filling polymer (GFP) layer on the dielectric layer;

etching the GFP layer back to a predetermined depth such that an exposed surface of the GFP layer is lower than surface of the dielectric layer to form a recess, thereby exposing portions of sidewalls of the via opening;

performing a surface treatment for unifying surface condition of the sidewalls and the exposed surface of the GFP layer;

filling the recess with a deep UV (DUV) photoresist to form a DUV photoresist layer on the dielectric layer;

performing a lithographic process to form a trench opening in the DUV photoresist layer above the via opening; and etching the dielectric layer and the GFP layer through the trench opening using the DUV photoresist layer as an etching mask.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

In the drawings.

DETAILED DESCRIPTION

Figure 1:
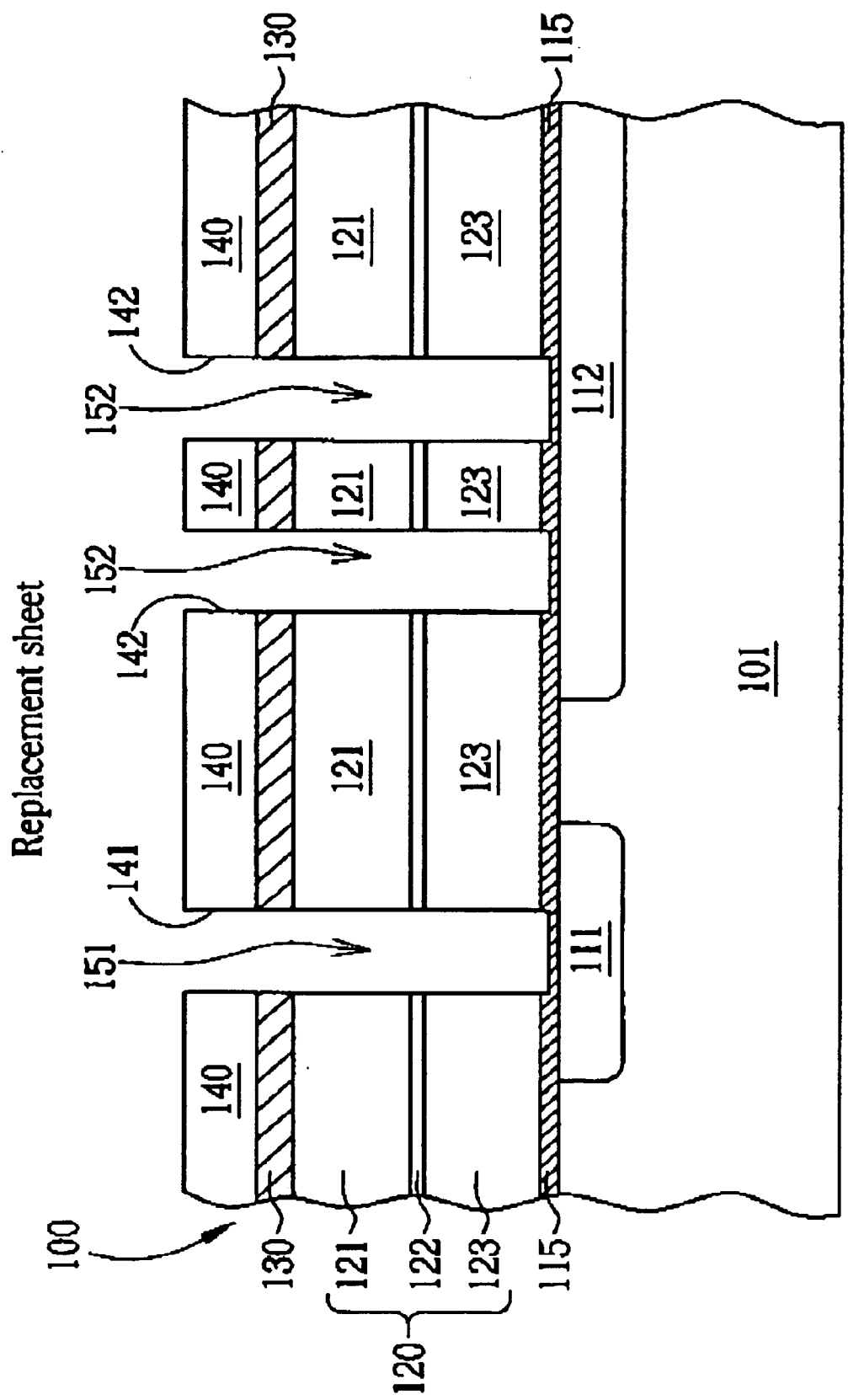
FIG. 1 to FIG. 5 are cross-sectional schematic diagrams showing several typical intermediate phases of a semiconductor wafer during the via-first dual damascene process according to the prior art method.
Figure 2:
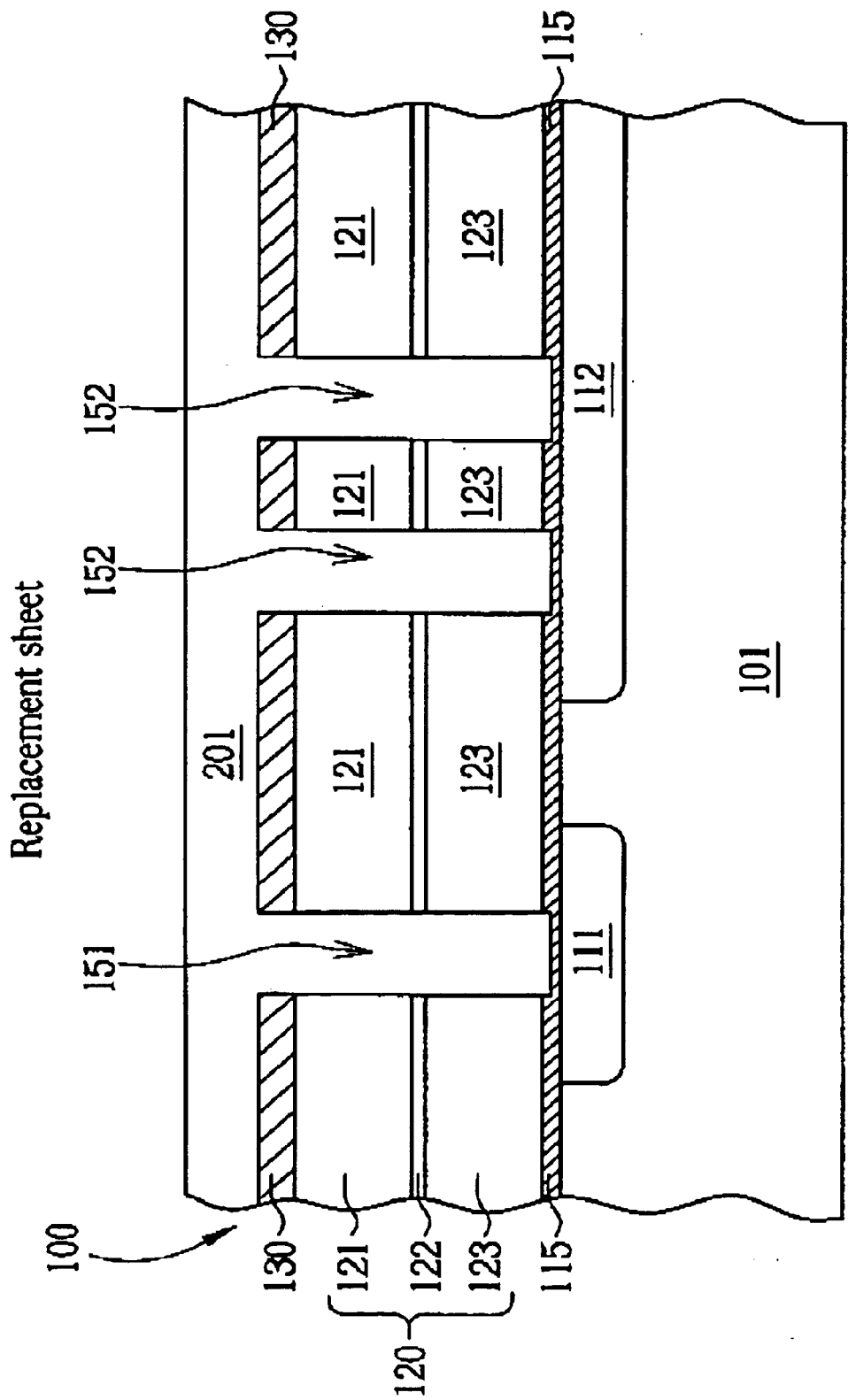
Figure 3:
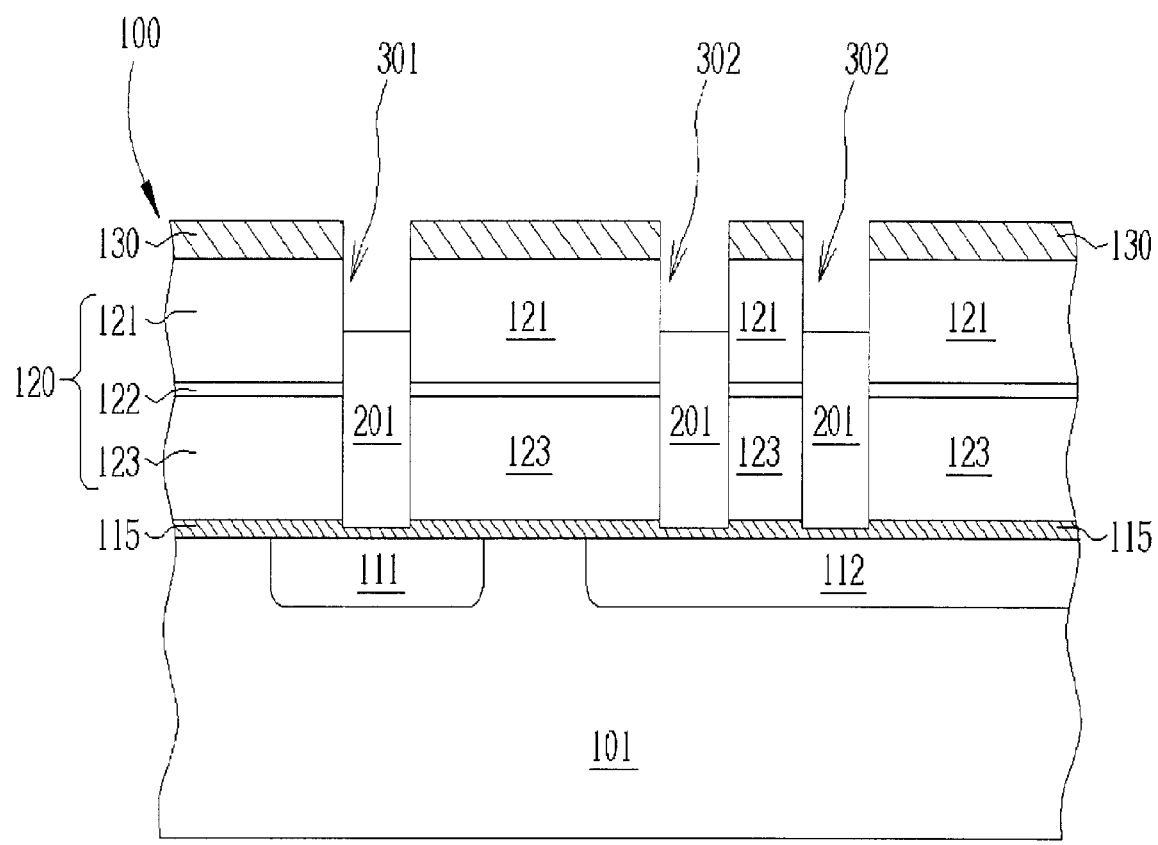
Figure 4:
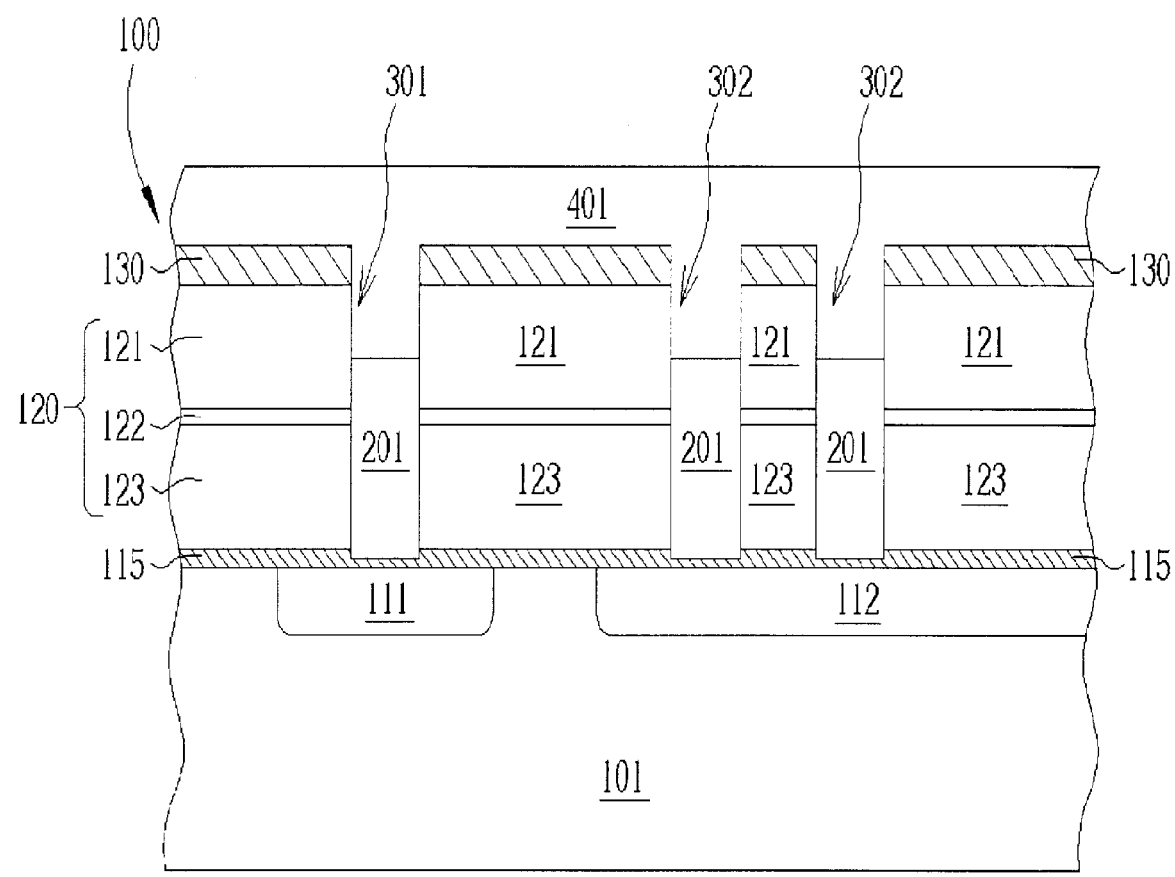
Figure 5:
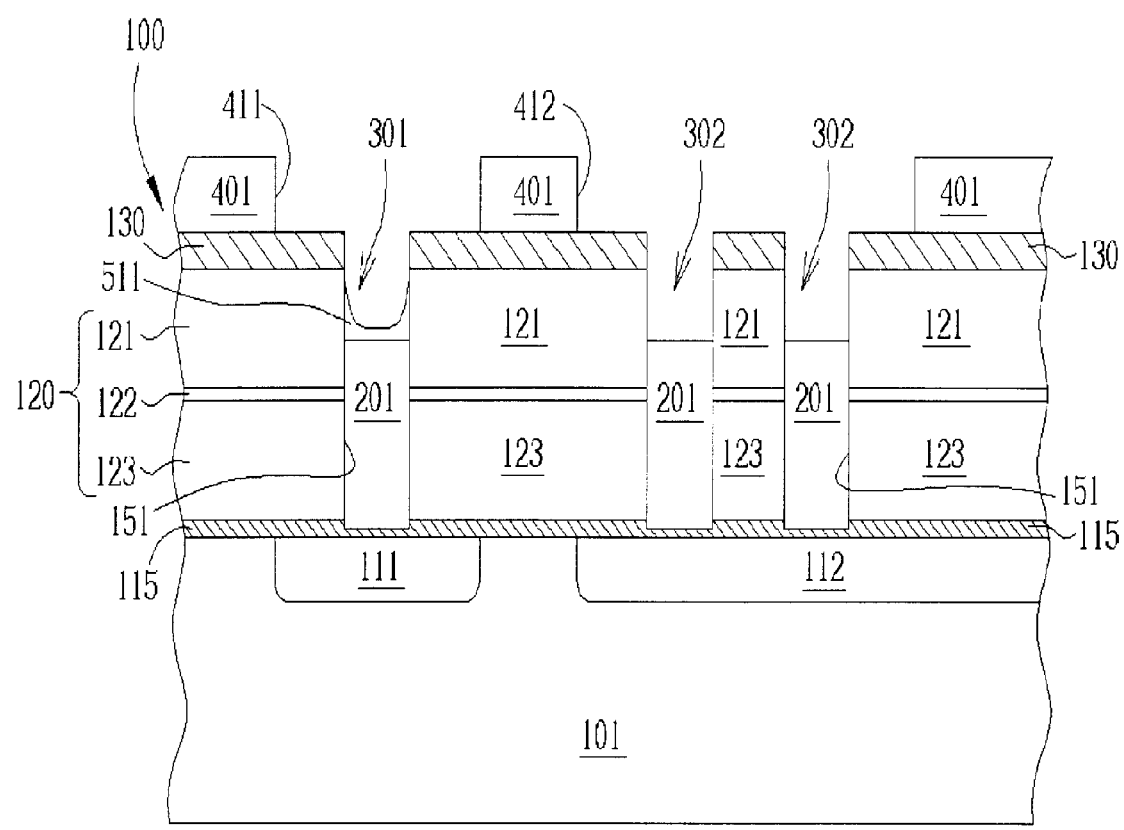
Figure 6:
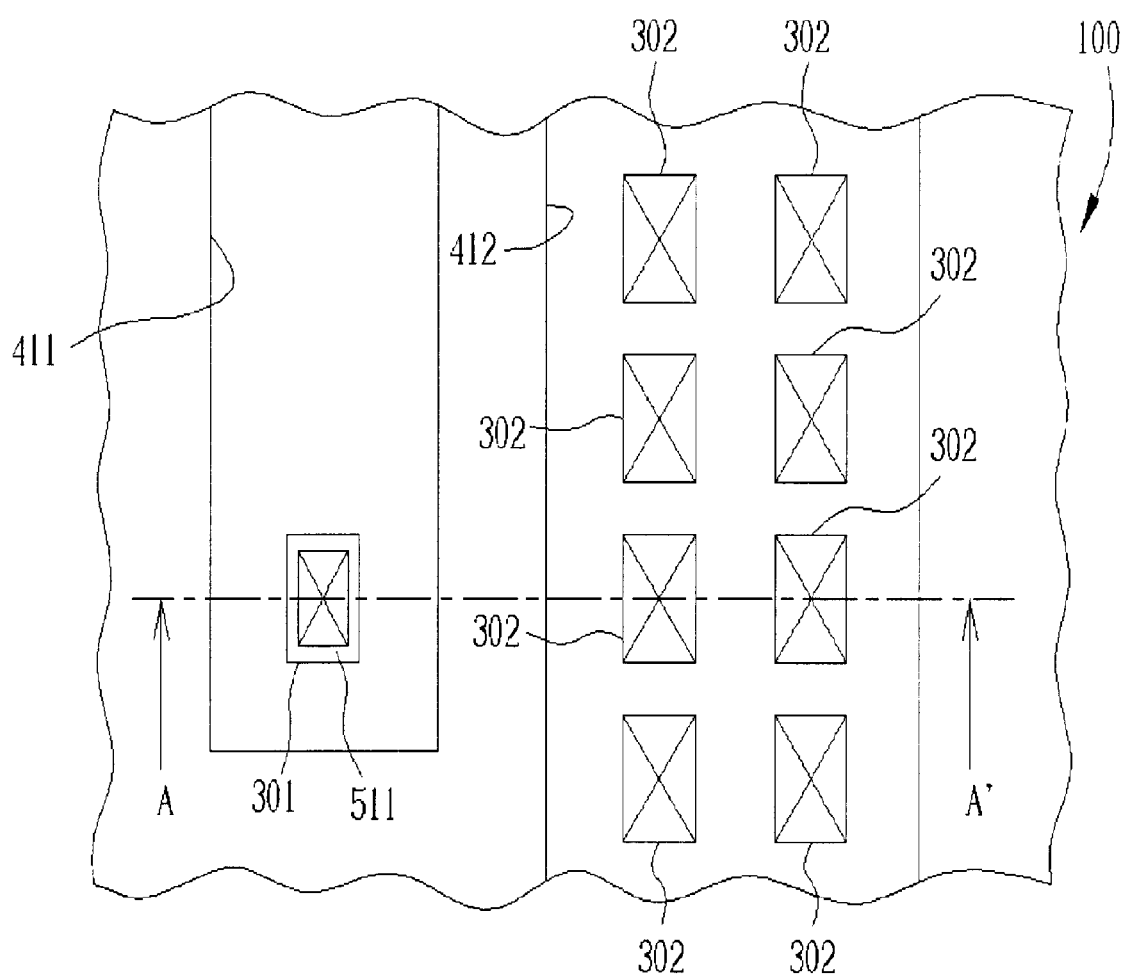
FIG. 6 is a top view of FIG. 5.
Figure 7:
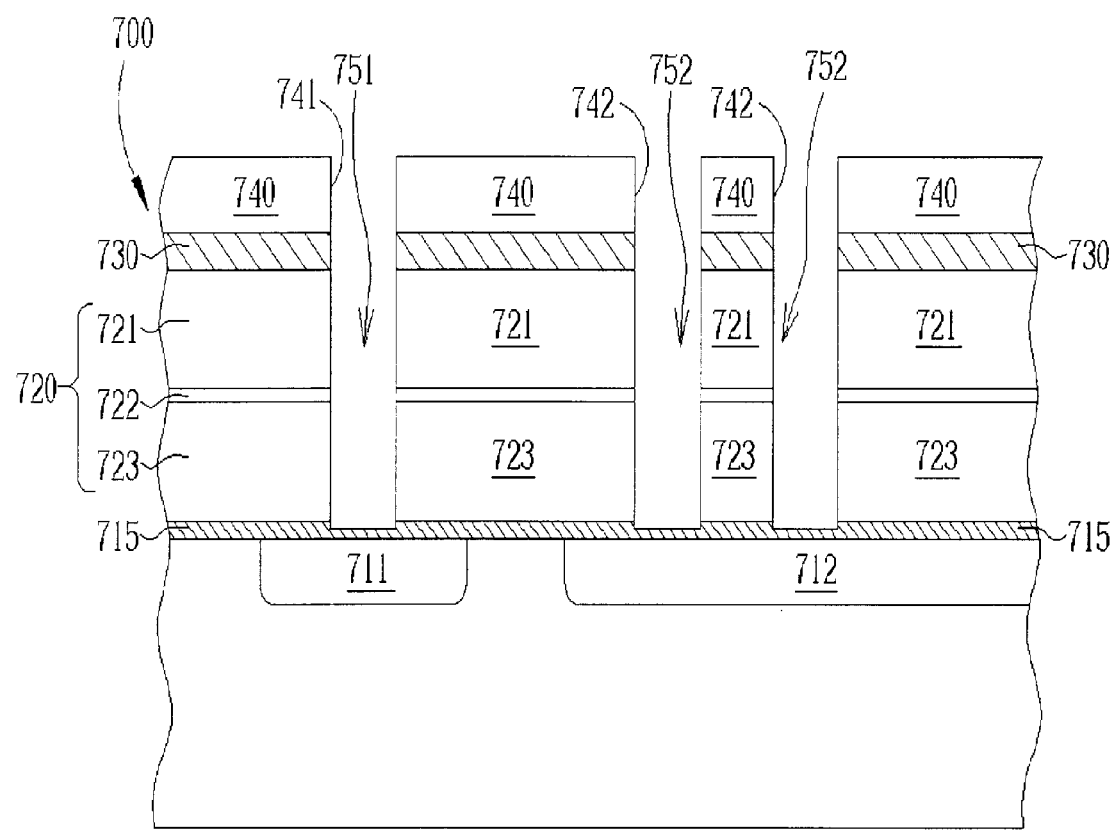
FIG. 7 to FIG. 11 are cross-sectional schematic diagrams illustrating the via-first dual damascene process according to the first preferred embodiment of this invention.

Please refer to FIG. 7 to FIG. 11. FIG. 7 to FIG. 11 are cross-sectional schematic diagrams illustrating the via-first dual damascene process according to the first preferred embodiment of this invention. As shown in FIG. 7, a semiconductor substrate 700 is provided. A conductive structure 711 and conductive structure 712 such as damascened copper wirings are provided in a device layer of the semiconductor substrate 700. Subsequently, a capping layer 715 such as silicon nitride is deposited to cover the exposed conductive structures 711 and 712, and the device layer over the semiconductor substrate 700. A stacked dielectric layer 720 is formed on the capping layer 715. The stacked dielectric layer 720 is typically composed of a first dielectric layer 721, a second dielectric layer 723, and an etch stop layer 722 interposed between the first dielectric layer 721 and the second dielectric layer 723. Preferably, both of the first dielectric layer 721 and the second dielectric layer 723 have a dielectric constant of less than 3.0. For example, suitable low-k material for the first dielectric layer 721 and the second dielectric layer 723 may be selected from the group including, but not limited to, FLARE™, SiLK™, poly(arylene ether) polymer, parylene, polyimide, fluorinated polyimide, HSQ, BCB, FSG, silicon dioxide, nanoporous silica.

Still referring to FIG. 7, a silicon oxy-nitride layer 730 is then deposited on the first dielectric layer 721. Thereafter, a first DUV photoresist layer 740 having via openings 741 and 742 is formed on the silicon oxy-nitride layer 730, assuming that the via opening 741 is an isolated via pattern, i.e. there is no other via opening located in the proximity of the via opening 741, and the via opening 742 is a dense via pattern. Using the first DUV photoresist layer 740 as a etching mask, an etching process is performed to etch away, in the order of, the silicon oxy-nitride layer 730, the stacked layer 720, to the capping layer 715, through the via openings 741 and 742, thereby forming deep via holes 751 and 752. Typically, the average diameter of the via holes 751 and 752 is about 0.1 micrometers to 0.2 micrometers.

Figure 8:
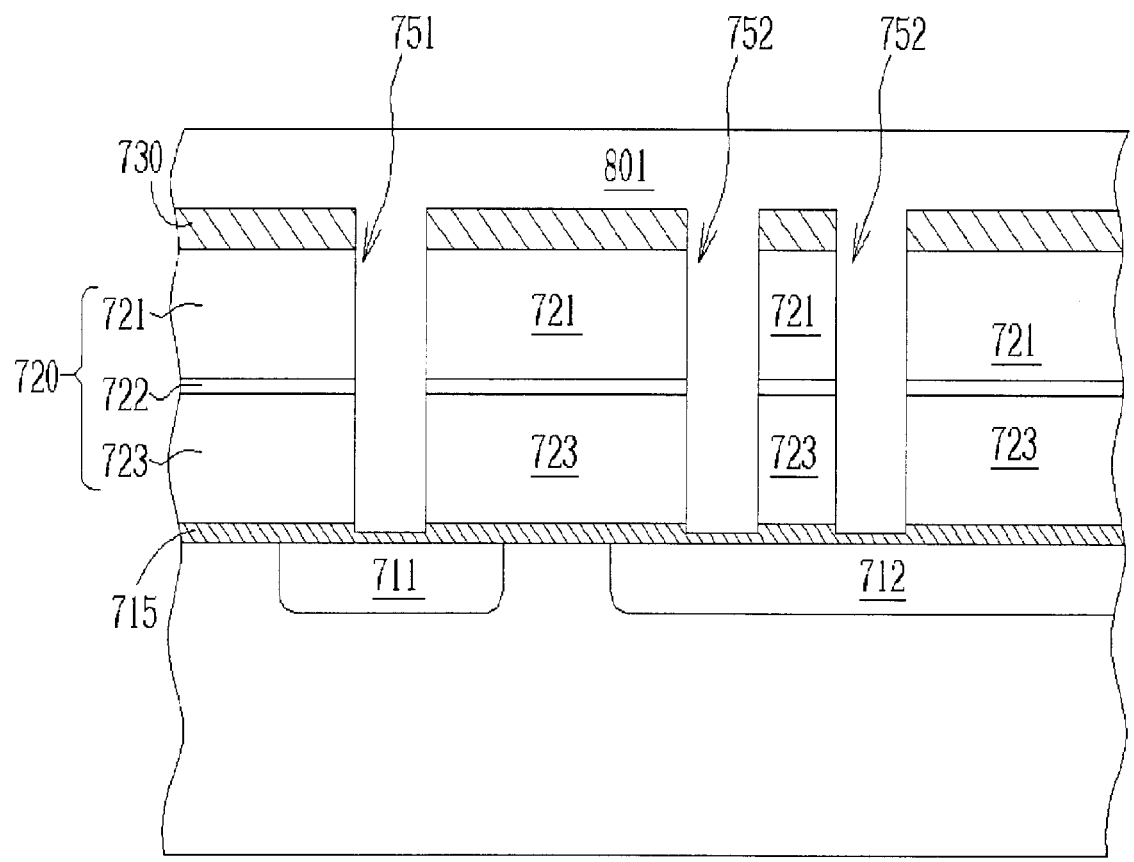
Figure 9:
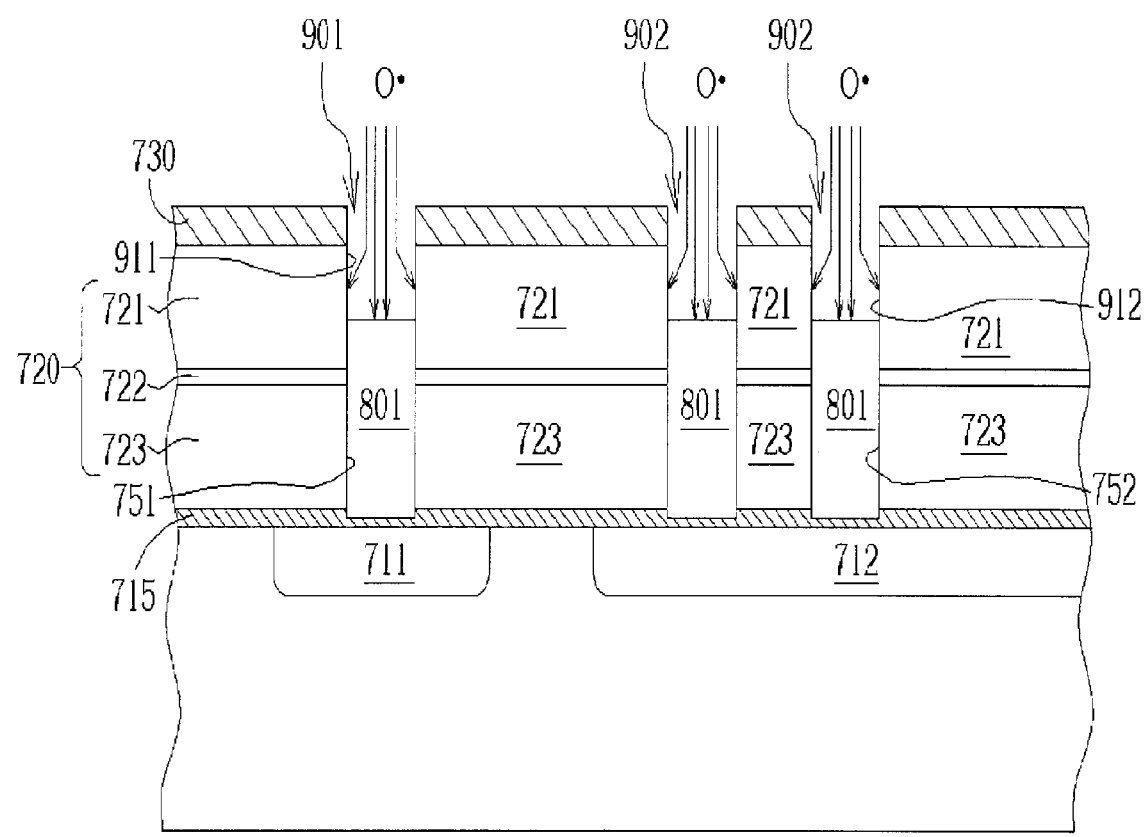

As shown in FIG. 8, after stripping the first DUV photoresist layer 740 off the silicon oxy-nitride layer 730 by oxygen plasma ashing, a gap-filling polymer (GFP) layer 801 is coated on the semiconductor substrate 700 and fills the via holes 751 and 752. The GFP layer 801 is typically composed of an i-line resist such as novolak, poly hydroxystyrene (PHS), or acrylate-based resins. Spin coating of the GFP layer 801 is known in the art and optional post-baking step may be carried out if desired. As shown in FIG. 9, the GFP layer 801 is then etched back to a predetermined depth, such that the exposed surface of the GFP layer 801 is lower than the surface of the silicon oxy-nitride layer 730, thereby forming recesses 901 and 902. The recesses 901 and 902 are defined by the respective sidewalls 911 and 912 and the corresponding exposed surfaces of the GFP layer 801. Subsequently, a surface treatment means for altering surface property of the exposed sidewalls 911 and 912 and the surfaces of the GFP layer 801 is carried out, thereby blocking the sidewalls 911 and 912 and the surfaces of the GFP layer 801, so that the following second DUV photoresist will not interact, either in chemical or physical way, with the sidewalls 911 and 912 and the surfaces of the GFP layer 801. The surface treatment means according to this invention also unifies the surface condition across the semiconductor substrate 700 before the coating of the second DUV photoresist.

According to the first preferred embodiment of this invention, the surface treatment means is using active radicals having a relatively low etching rate (to GFP layer 801) of, for example, less than 100 Å/min, to contact the sidewalls 911 and 912 and the surfaces of the GFP layer 801. Such active radicals may be oxygen radicals, superoxide radicals, or the like. By doing this, the exposed hydrophobic surface of the GFP layer 801 is mostly or completely transformed into a hydrophilic surface. It is found that such active radicals can produce hydroxyl bonds on the sidewalls 911 and 912 and the surfaces of the GFP layer 801, such that the following developer, which is. hydrophilic, can completely remove the exposed DUV photoresist at the bottom of the isolated recess 901. It is noted that suitable sources of the active radicals are not limited to the oxygen radicals and superoxide radicals. Other radical sources such as ozone, hydrogen peroxide, or any other oxygen-containing gases (but not including those containing nitrogen) such as carbon monoxide or carbon dioxide, may also be used. Further, the surface treatment means of this invention may be carried out in dry manner or wet manner (no matter dipping or washing).

Figure 10:
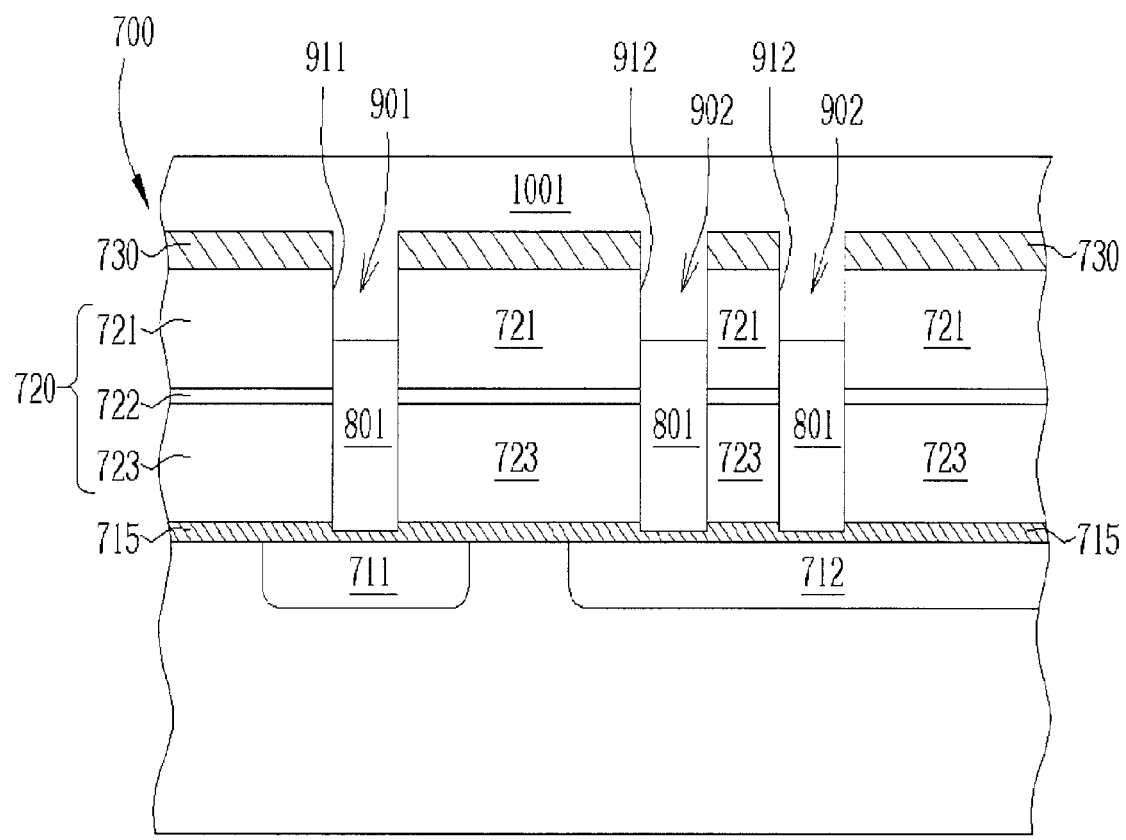

As shown in FIG. 10, a second DUV photoresist layer 1001 is coated on the semiconductor substrate 700 and fills the treated recesses 901 and 902 using spin coating method known in the art.

Figure 11:
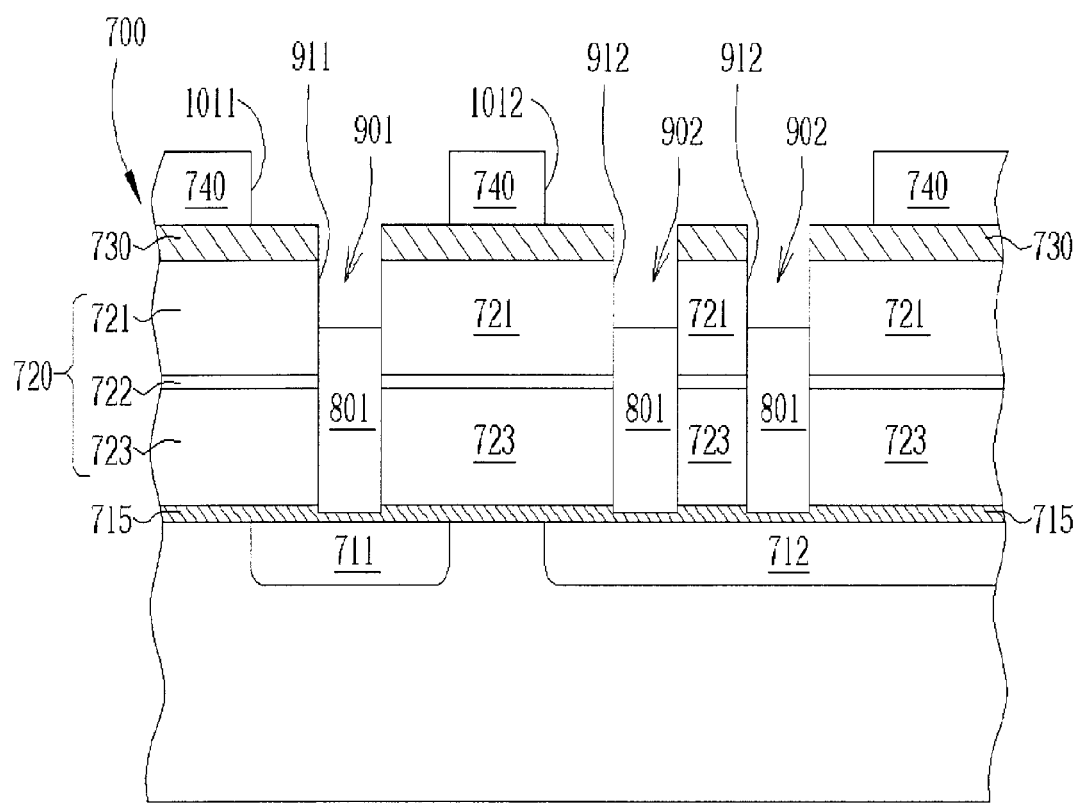

As shown in FIG. 11, following the coating of the second DUV photoresist layer 1001, a lithographic process is carried out. In the lithographic process (or trench photo-lithographic process), a mask (not shown) having a predetermined trench pattern thereon is provided as a photo-mask, which is positioned over the semiconductor substrate 700. Likewise, light such as deep UV is projected on the photo-mask and passes through clear areas of the photo-mask to irradiate the underlying second DUV photoresist layer 1001, thereby forming latent trench images (not shown), which is soluble in a developer, over the respective recesses 901 and 902 in the second DUV photoresist layer 1001. Thereafter, the exposed second DUV photoresist layer 1001 is developed using a proper developer that is usually hydrophilic. The latent trench images are removed to form trenches 1011 and 1012 over the recesses the recesses 901 and 902, respectively. As shown, the DUV residue in the recess 901 is completely removed.

Figure 12:
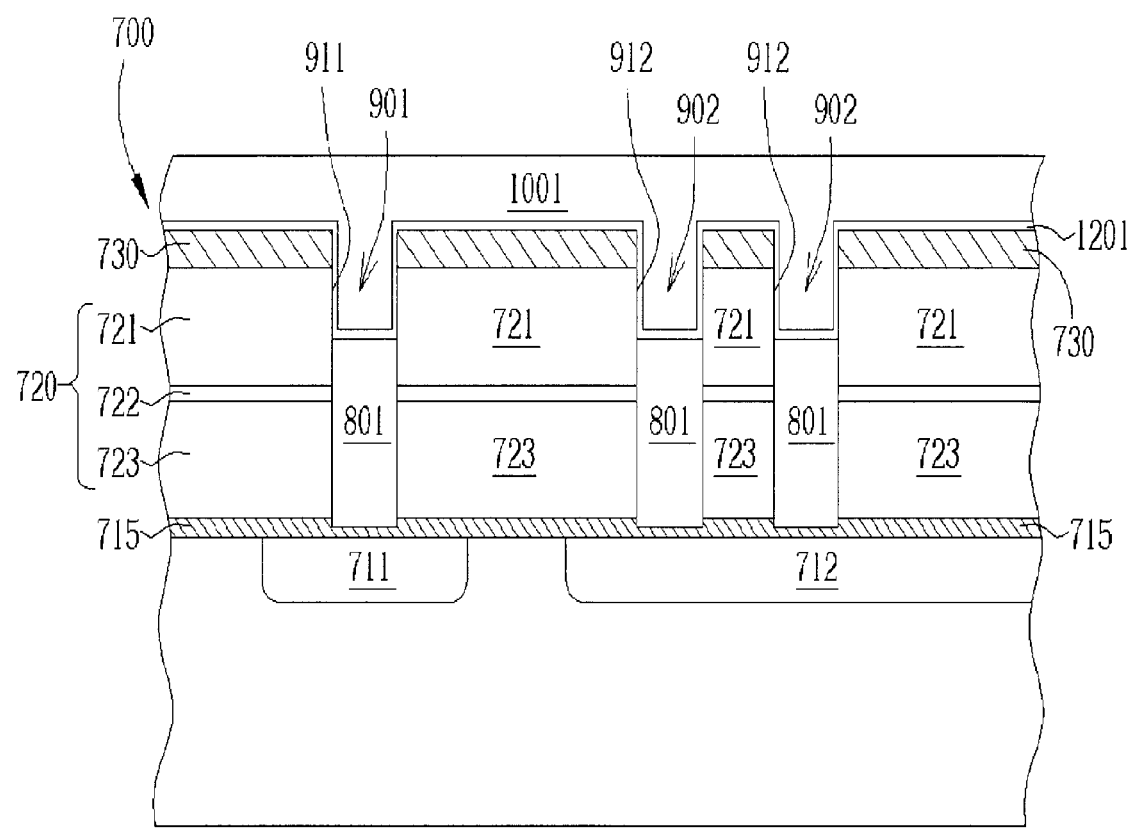
FIG. 12 and FIG. 13 are cross-sectional schematic diagrams illustrating the via-first dual damascene process according to the second preferred embodiment of this invention.
Figure 13:
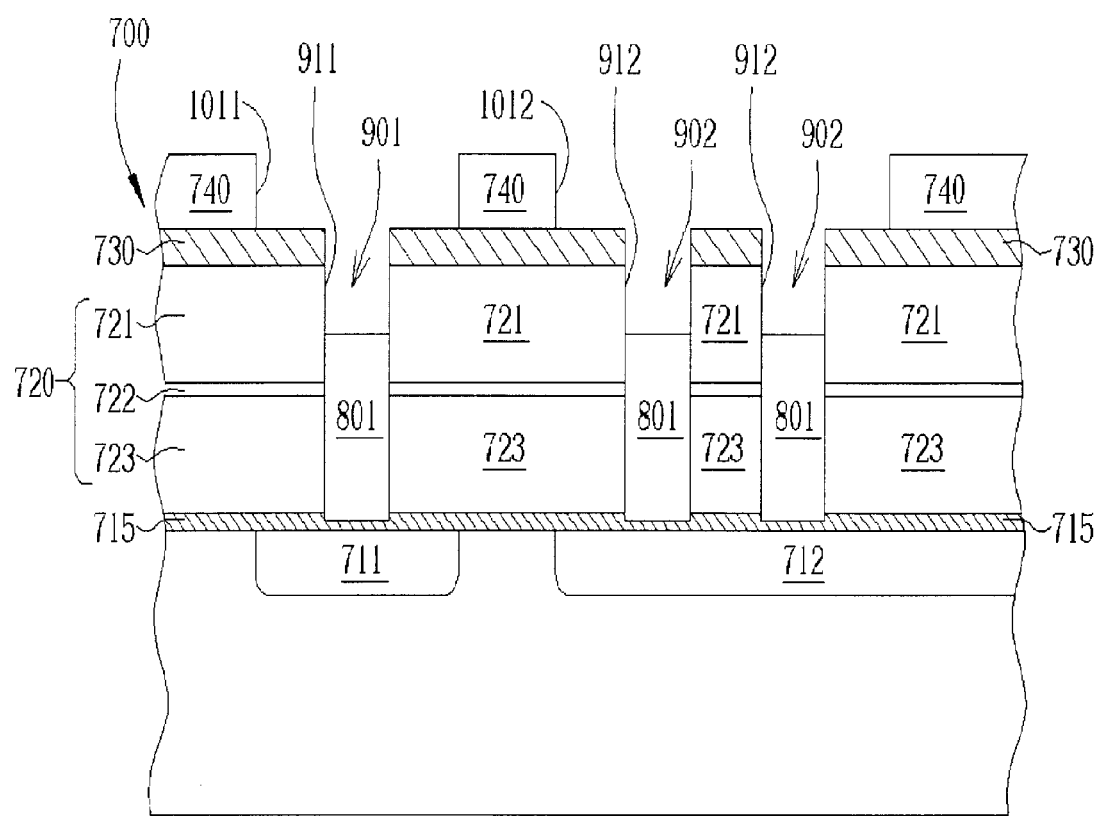

Please refer to FIG. 12 and FIG. 13. FIG. 12 and FIG. 13 are cross-sectional schematic diagrams illustrating the via-first dual damascene process according to the second preferred embodiment of this invention. As shown in FIG. 12, after stripping the first DUV photoresist layer 740 off the silicon oxy-nitride layer 730 by oxygen plasma ashing, a gap-filling polymer (GFP) layer 801 is coated on the semiconductor substrate 700 and fills the via holes 751 and 752. The GFP layer 801 is then etched back to a predetermined depth, such that the exposed surface of the GFP layer 801 is lower than the surface of the silicon oxy-nitride layer 730, thereby forming recesses 901 and 902. The recesses 901 and 902 are defined by the respective sidewalls 911 and 912 and the corresponding exposed surfaces of the GFP layer 801. Subsequently, a surface treatment means for unifying surface condition of the exposed sidewalls 911 and 912 and the surfaces of the GFP layer 801 is carried out, thereby blocking the sidewalls 911 and 912 and the surfaces of the GFP layer 801, so that the following second DUV photoresist will not interact, either in chemical or physical way, with the sidewalls 911 and 912 and the surfaces of the GFP layer 801. The surface treatment means according to this invention also unifies the surface condition across the semiconductor substrate 700 before the coating of the second DUV photoresist.

According to the second preferred embodiment of this invention, the surface treatment means is depositing a conformal polymer film 1201 over the sidewalls 911 and 912 and the surfaces of the GFP layer 801. Preferably, the polymer film 1201 is deposited by using a plasma composition of $CHF_3/H_2$, $CF_4/CHF_3$, or the like. The thickness of the polymer film 1201 is about 50 angstroms to 150 angstroms.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A via-first dual damascene process, comprising:
providing a semiconductor substrate having a conductive structure and a dielectric layer on the semiconductor substrate, wherein the dielectric layer has a via opening exposing the conductive structure;
filling the via opening with a gap-filling polymer to form a gap-filling polymer (GFP) layer on the dielectric layer;
etching the GFP layer back to a depth such that an exposed surface of the GFP layer in lower than surface of the dielectric layer to form a recess, thereby exposing portions of sidewalls of the via opening; and
performing a surface treatment for altering surface property of the sidewalls and the exposed surface of the GFP layer, thereby preventing a subsequent deep UV photoresist from interacting with the sidewalls or the exposed surface of the GFP layer either in a chemical or physical way, wherein the surface treatment is using active radicals having a relatively low etching rate (with respect to the GFP layer) to contact the sidewalls and the exposed surface of the GFP layer.

2. The via-first dual damascene process of claim 1 wherein the GFP layer is composed of an i-line resist.

3. The via-first dual damascene process of claim 1 wherein the dielectric layer has a dielectric constant of less than 3.0.

4. The via-first dual damascene process of claim 1 wherein an etching stop layer is provided on the dielectric layer.

5. The via-first dual damascene process of claim 4 wherein the etching stop layer is made of silicon oxy-nitride.

6. The via-first dual damascene process of claim 1 wherein the relatively low etching rate is less than 100 Å/min.

7. The via-first dual damascene process of claim 1 wherein the active radicals comprises oxygen radical and superoxide radical.

8. The via-first dual damascene process of claim 1 wherein the by using active radicals having a relatively low etching rate (with respect to the GFP layer) to contact the sidewalls and the exposed surface of the GFP layer, the exposed surface of the GFP layer is transformed into a hydrophilic surface.

9. The via-first dual damascene process of claim 1 wherein the surface treatment means is depositing a conformal polymer film over the sidewalls and the exposed surface of the GFP layer.

10. The via-first dual damascene process of claim 9 wherein the polymer film is deposited by using a plasma composition of $CHF_3/H_2$ or $CF_4/CHP_3$.

11. The via-first dual damascene process of claim 9 wherein the thickness of the polymer film is about 50 angstroms to 150 angstroms.

12. A via-first dual damascene process, comprising:
providing a semiconductor substrate having a conductive structure and a dielectric layer on the semiconductor substrate, wherein the dielectric layer has a via opening exposing the conductive structure;
filing the via opening with a gap-filling polymer to form a gap-filling polymer (GFP) Layer on the dielectric layer;
etching the GFP layer back to a depth such that an exposed surface of the GFP layer is lower than surface of the dielectric layer to form a recess, thereby exposing portions of sidewalls of the via opening;
performing a surface treatment for unifying surface condition of the sidewalls and the exposed surface of the GFP layer, wherein the surface treatment is using active radicals having a relatively low etching rate (with respect to the GFP layer) to contact the sidewalls and the exposed surface of the GFP layer;
filling the recess with a deep UV (DUV) photoresist to form a DUV photorosist layer on the dielectric layer;
performing a lithographic process to form a trench opening in the DUV photoresist layer above the via opening; and etching the dielectric layer and the GFP layer through the trench opening using the DUV photoresist layer as an etching mask.

13. The via-first dual damascene process of claim 12 wherein the GFP layer is composed of an i-line resist.

14. The via-first dual damascene process of claim 12 wherein the dielectric layer has a dielectric constant of less than 3.0.

15. The via-first dual damascene process of claim 12 wherein an etching stop layer is provided on the dielectric layer.

16. The via-first dual damascene process of claim 12 wherein the relatively low etching rate is less than 100 Å/min.

17. The via-first dual damascene process of claim 12 wherein the active radicals comprises oxygen radical and superoxide radical.

18. The via-first dual damascene process of claim 12 wherein by using active radicals having a relatively low etching rate (with respect to the GFP layer) to contact the sidewalls and the exposed surface of the GFP layer, the exposed surface of the GFP layer is transformed into a hydrophilic surface.

19. The via-first dual damascene process of claim 12 wherein the surface treatment means is depositing a conformal polymer film over the sidewalls and the exposed surface of the GFP layer.

20. The via-first dual damascene process of claim 19 wherein the polymer film is deposited by using a plasma composition of $CHF_3/H_2$ or $CF_4/CHF_3$.

21. The via-first dual damascene process of claim 19 wherein the thickness of the polymer film is about 50 angstroms to 150 angstroms.

* * * * *